(12) United States Patent
Lin et al.

(10) Patent No.: US 7,804,104 B2
(45) Date of Patent: Sep. 28, 2010

(54) LIGHT-EMITTING DIODE WITH HIGH LIGHTING EFFICIENCY

(75) Inventors: Su-Hui Lin, Taichung (TW);
Sheng-Hsien Hsu, Taiping (TW);
Jing-Jie Dai, Changhua (TW); Tzong Liang Tsai, Taichung (TW)

(73) Assignee: Huga Optotech Inc., Taichung (TW)

( * ) Notice: Subject to any disclaimer, the term of this patent is extended or adjusted under 35 U.S.C. 154(b) by 0 days.

(21) Appl. No.: 12/421,869

(22) Filed: Apr. 10, 2009

(65) Prior Publication Data

US 2010/0176408 A1    Jul. 15, 2010

(30) Foreign Application Priority Data

Jan. 13, 2009    (TW) .............................. 98101054 A

(51) Int. Cl.
*H01L 27/15* (2006.01)

(52) U.S. Cl. .......................................... 257/98; 257/79

(58) Field of Classification Search .................... 257/13, 257/79–103, 918; 438/22–47, 69, 493, 503, 438/507, 956
See application file for complete search history.

(56) References Cited

U.S. PATENT DOCUMENTS

| 6,794,688 B2 * | 9/2004 | Nakatsu et al. ................ 257/98 |
| 2008/0157108 A1 * | 7/2008 | Yu et al. ........................ 257/98 |

* cited by examiner

*Primary Examiner*—Wai-Sing Louie
*Assistant Examiner*—Bilkis Jahan
(74) *Attorney, Agent, or Firm*—Chun-Ming Shih

(57) ABSTRACT

The invention discloses a light-emitting diode, including a substrate, a first conductive type semiconductor layer, a second conductive type semiconductor layer, a light-emitting layer and plural laminated structures. The first conductive type semiconductor layer, the light-emitting layer and the second conductive type semiconductor layer are formed on the substrate in sequence. The plural laminated structures are formed on the upper surface of the second conductive type semiconductor layer such that the upper surface is partially exposed. Each laminated structure consists of at least one first insulated layer with a high refractive index and at least one second insulated layer with a low refractive index, where the at least one first insulated layer and the at least one second insulated layer are alternately formed to obtain said each laminated structure. Thereby, light emitted from the light-emitting layer can be reflected by the laminated structures to enhance the light-extraction efficiency.

11 Claims, 5 Drawing Sheets

LIGHT-EMITTING DIODE WITH HIGH LIGHTING EFFICIENCY

BACKGROUND OF THE INVENTION

1. Field of the Invention

The invention relates to a light-emitting diode, and more particularly, to a light-emitting diode with high lighting efficiency.

2. Description of the Prior Art

Nowadays, applications of the light-emitting diode are everywhere in our daily life. There are different kinds of light-emitting diodes widely utilized in various products, e.g. key-switch systems, backlight modules, vehicle illuminations, decorating lamps, remote controllers, etc. To ensure that the light-emitting diode have better reliability and lower power consumption, it demands the light-emitting diode to maintain high lighting efficiency.

Please refer to FIG. 1. FIG. 1 is a diagram illustrating a light-emitting diode 1 in prior art. As shown in FIG. 1, the light-emitting diode 1 includes a substrate 10, an N-type GaN layer 11, a light-emitting layer 12, a P-type GaN layer 13, an electrode 14 and an electrode 15. In order to drive the P-type GaN layer 13 and the N-type GaN layer 11 for operating the light-emitting diode 1, the electrode 15 is formed on the P-type GaN layer 13 and the electrode 14 is formed on the N-type GaN layer 11.

Theoretically, the lighting efficiency of the light-emitting diode is related to the internal quantum yield and the light-extraction efficiency. The internal quantum yield is affected by characteristic and quality of the material. The light-extraction efficiency is the radio ratio defined by the radiation from the light-emitting diode to the surrounding air or the packed epoxy. Although there are lots of disclosed designs about different structures of the light-emitting diodes, it is still a critical problem to find a light-emitting diode structure capable of operating under high light-extraction efficiency and high lighting efficiency.

SUMMARY OF THE INVENTION

To solve the aforesaid problems, a scope of the invention is to provide a mobile communication apparatus.

According to an embodiment of the invention, the light-emitting diode includes a substrate, a first doping type semiconductor layer, a light-emitting layer, a second doping type semiconductor layer, plural laminated structures and a conductive layer.

The first doping type semiconductor layer is formed on the substrate. The light-emitting layer is formed on the first doping type semiconductor layer. The second doping type semiconductor layer is formed on the light-emitting layer. The second doping type semiconductor layer has a top surface. The laminated structures are formed on the top surface of the second doping type semiconductor layer, such that the top surface is partially exposed. Each laminated structure is formed in a way of alternately stacking at least one first insulated layer with a high refractive index and at least one second insulated layer with a low refractive index. The conductive layer is formed to cover the laminated structures and the exposed part of the top surface of the second doping type semiconductor layer.

Compared with prior art, in the light-emitting diode of the invention, the laminated structures may reflect the light from the light-emitting layer, so as to elevate the light-extraction efficiency of the light-emitting diode. At the same time, the laminated structures may block the current and elevate the current density, so as to improve the lighting efficiency of the light-emitting diode.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
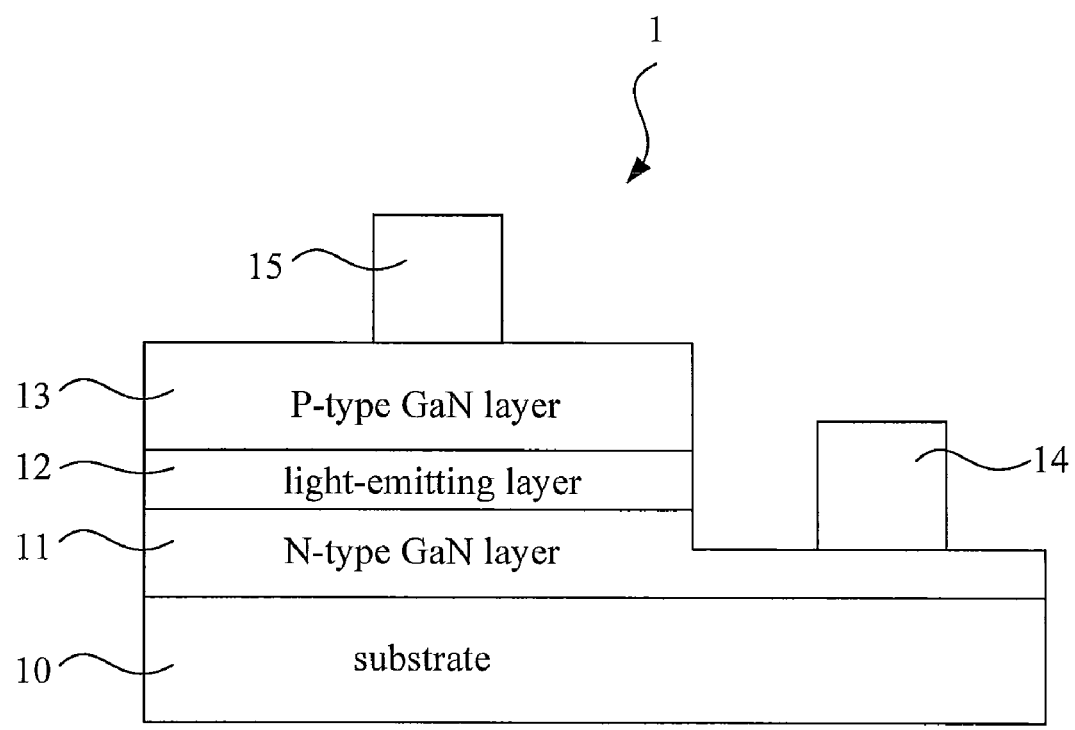
FIG. 1 is a diagram illustrating a light-emitting diode in prior art.
Figure 2A:
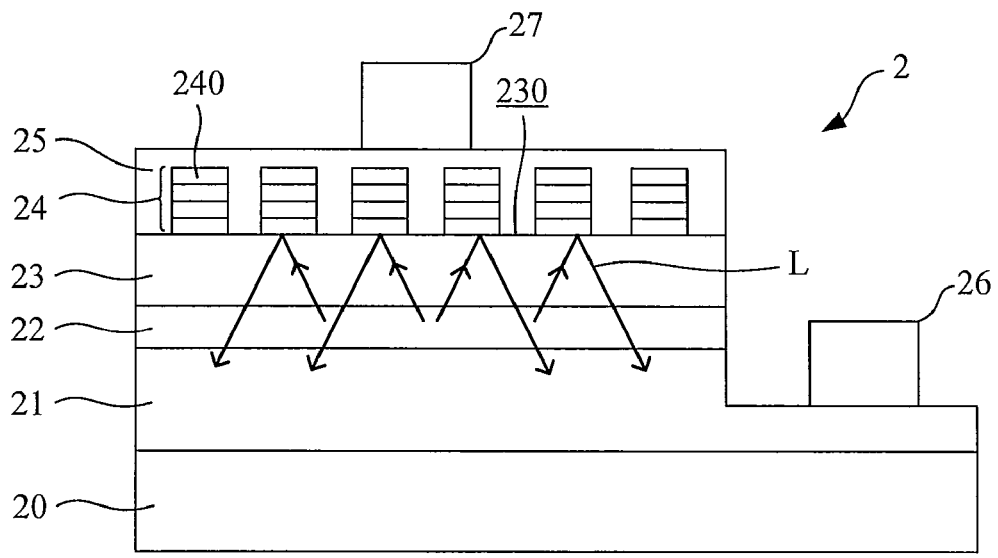
FIG. 2A is a sectional view illustrating a light-emitting diode according to an embodiment of the invention.

Please refer to FIG. 2A. FIG. 2A is a sectional view illustrating a light-emitting diode 2 according to an embodiment of the invention.

As shown in FIG. 2A, the light-emitting diode 2 includes a substrate 20, a first doping type semiconductor layer 21, a light-emitting layer 22, a second doping type semiconductor layer 23, a plurality of laminated structures 24, a transparent conductive layer 25 and electrodes (26, 27).

The first doping type semiconductor layer 21 is formed on the substrate 20. The light-emitting layer 22 is formed on the first doping type semiconductor layer 21. The second doping type semiconductor layer 23 is formed on the light-emitting layer 22. The second doping type semiconductor layer 23 has a top surface.

In practical application, the substrate 20 can be formed of a transparent material, e.g. $SiO_2$, GaN, sapphire, ZnO. The first doping type semiconductor layer 21 and the second doping type semiconductor layer 23 can be a nitride material. In an embodiment, the first doping type can be N-type, and the second doping type can be P-type. For example, the first doping type semiconductor layer 21 can be N-type GaN layer, and the second doping type semiconductor layer 23 can be P-type GaN layer.

Figure 2B:
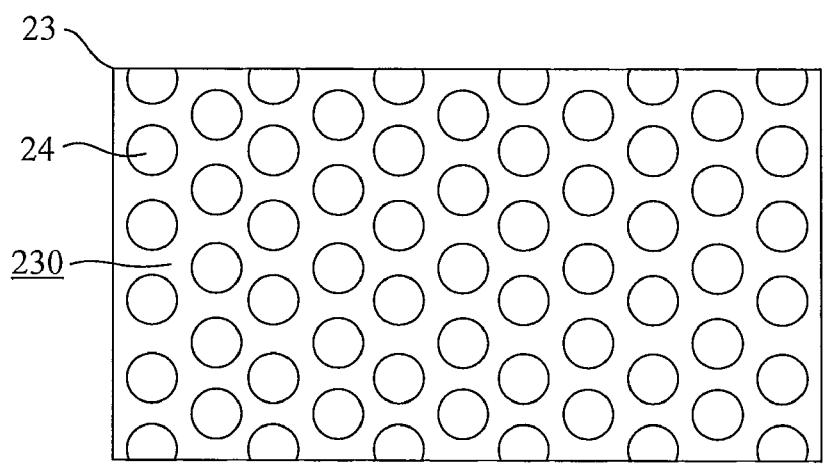
FIG. 2B is a top view of the second doping type semiconductor layer in FIG. 2A.

The laminated structures 24 are independently formed on the top surface of the second doping type semiconductor layer 23, such that the top surface is partially exposed. Please refer to FIG. 2B. FIG. 2B is a top view of the second doping type semiconductor layer 23 in FIG. 2A. As shown in FIG. 2B, in an embodiment, the laminated structures can be, but not limited to, rod-shaped structures. There are gaps existed between the laminated structures 24. Therefore, after the laminated structures 24 being formed, part of the top surface of the second doping type semiconductor layer 23 is exposed (as the exposed part 230 shown in FIG. 2B).

To be noticed that, each laminated structure 24 is formed in a way of alternately stacking at least one first insulated layer 240 with a high refractive index and at least one second insulated layer 240 with a low refractive index.

In practical applications, the first insulated layer can be made of one material or a mixture of at least two materials selected from the group consisting of $Si_3N_4$, $TiO_2$, $Ta_2O_5$, $Nb_2O_5$, $CeO_2$ and ZnS. The second insulated layer can be made of one material or a mixture of at least two materials selected from the group consisting of $SiO_2$ and $MgF_2$.

Figure 2C:
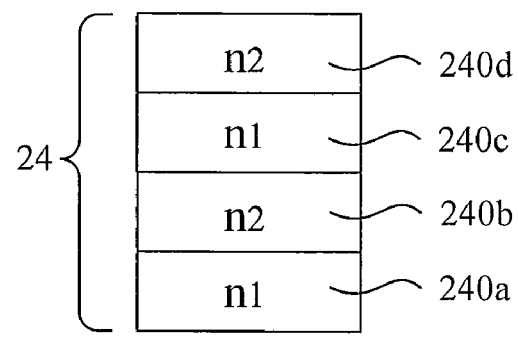
FIG. 2C is a structural view of the laminated structure according to an embodiment.

Please refer to FIG. 2C. FIG. 2C is a structural view of the laminated structure 24 according to an embodiment. As shown in FIG. 2C, the laminated structure 24 may include four transparent insulating layers (240a, 240b, 240c, 240d), which respectively have refractive indices n1, n2, n1, n2. For example, the insulating layer 240a and the insulating layer 240c can be made of a $Si_3N_4$ material with the refractive index of 1.89; the insulating layer 240b and the insulating layer 240d can be made of a $SiO_2$ material with the refractive index of 1.45. In other words, the laminated structure 24 in FIG. 2C can be formed in a way of stacking the $Si_3N_4$ layers with higher refractive index and the $SiO_2$ layers with lower refractive index. To be noticed that, the number of the insulating layers within each laminated structure 24 can be designed according to the practical application.

The conductive layer 25 is formed to cover the laminated structures 24 and the exposed part 230 of the top surface of the second doping type semiconductor layer 23. The electrode 26 is formed on the first doping type semiconductor layer 21. In practical application, the conductive layer 25 can be made of a transparent conductive material, e.g. an ITO material. In some other cases, the conductive layer 25 can be made of a metal material. The electrode 26 is formed on the first doping type semiconductor layer 21. The electrode 27 is formed on the conductive layer 25. Practically, the electrodes (26, 27) can be made of a Cr—Au alloy.

To be noticed that, the optical characteristic of each laminated layer 24 is defined by the thicknesses of the insulating layers 240 within each laminated layer 24. Please refer to FIG. 2A, in an embodiment, the thickness of each insulating layer 240 equals to ¼ wavelength of the light emitted from the light-emitting layer 22. Accordingly, the laminated structures have highly optical reflection.

Figure 2D:
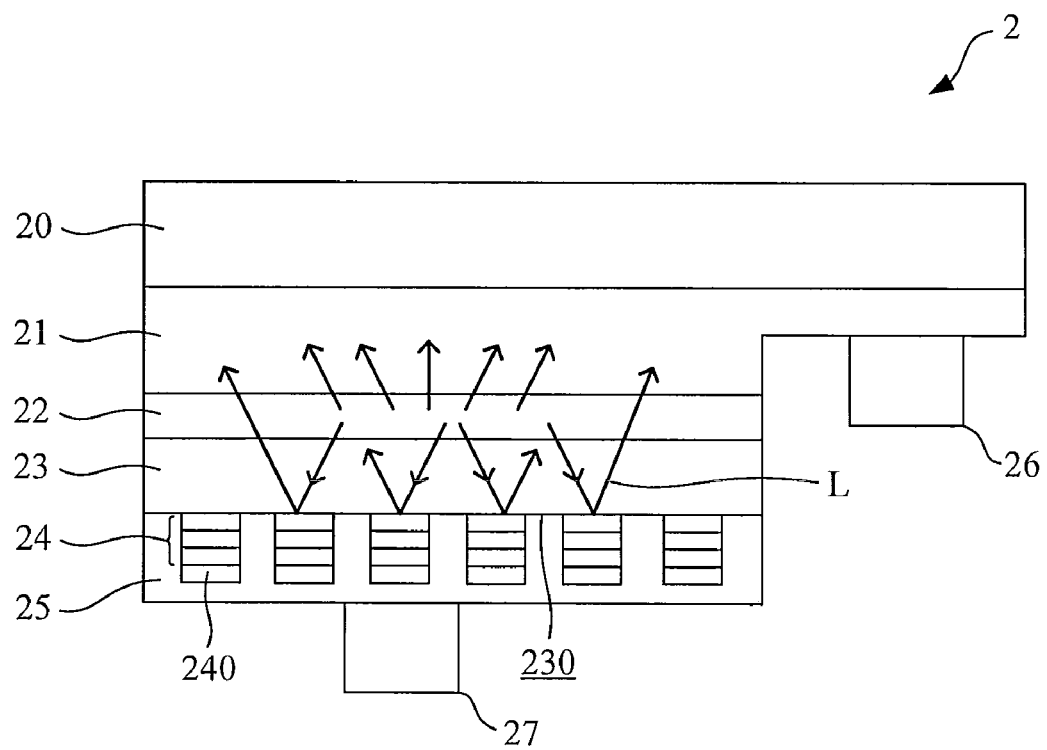
FIG. 2D is a schematic diagram illustrating a reversely implemented light-emitting diode 2 in FIG. 2A according to an embodiment.

Please refer to FIG. 2D. FIG. 2D is a schematic diagram illustrating a reversely implemented light-emitting diode 2 in FIG. 2A according to an embodiment. Because the laminated structures 24 may reflect the light L, the light-emitting diode 2 disclosed in FIG. 2A can be implemented reversely, so as to guide the light L emitted from the light-emitting layer 22 toward the light-through substrate 20, for improving the light-extraction efficiency.

Figure 2E:
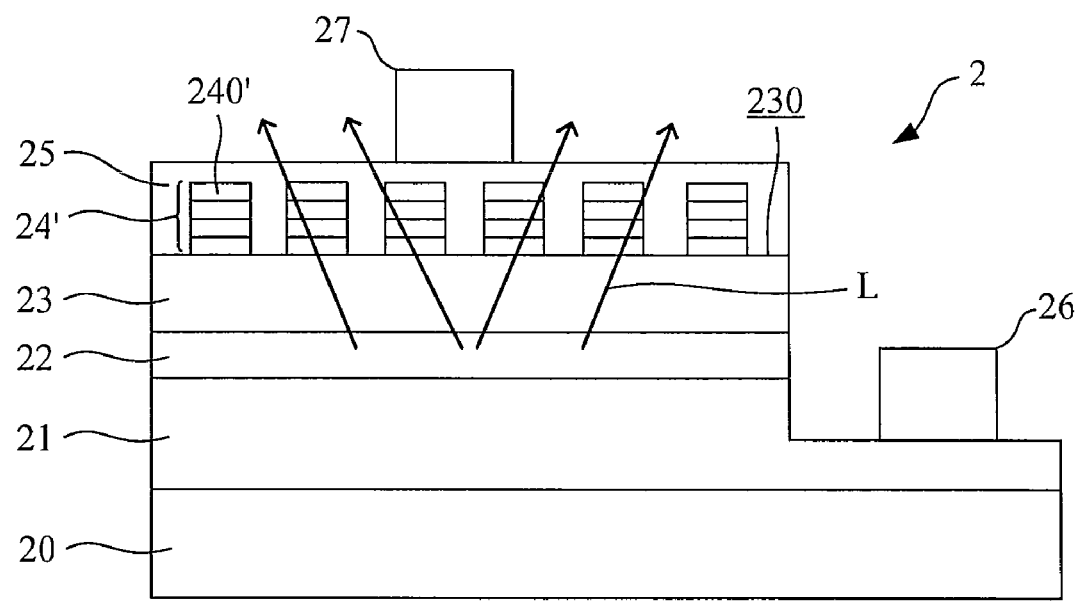
FIG. 2E and FIG. 2F are sectional views illustrating the light-emitting diodes according to other embodiments of the invention.

Please refer to FIG. 2E. FIG. 2E is a sectional view of the light-emitting diode 2 according to another embodiment of the invention. Compared with the laminated structures 24 with high optical reflection in FIG. 2A, in FIG. 2E, a thickness of each insulating layer 240' of a laminated structures 24' equals to ½ wavelength of the light emitted by the light-emitting layer 22. Accordingly, the laminated structures 24' may have high optical transmittance, so as to improve the light-extraction efficiency of the light-emitting diode 2.

There are two major advantages of the light-emitting diode in the invention:

(1) By adjusting the thicknesses of the insulating layers properly, the laminated structures may function as an optical reflector, for reflecting the light L from the light-emitting layer 22. Accordingly, the light-emitting diode may have its light concentrated on one side, so as to improve the light-extraction efficiency of the light-emitting diode 2; or on the other hand, the laminated structures may have high optical transmittance to improve the light-extraction efficiency.

(2) After the light-emitting diode 2 being charged, a current flows between the second doping type semiconductor layer 23 and the transparent conductive layer 25. Because the plural laminated structures 24 are formed by the transparent insulating layers and there are gaps between the laminated structures 24, the current is blocked by the laminated structures 24 and only capable of flowing through the gaps between the laminated structures 24. Therefore, the current density can be elevated by the laminated structures 24, so as to improve the lighting efficiency of the light-emitting diode.

Figure 2F:
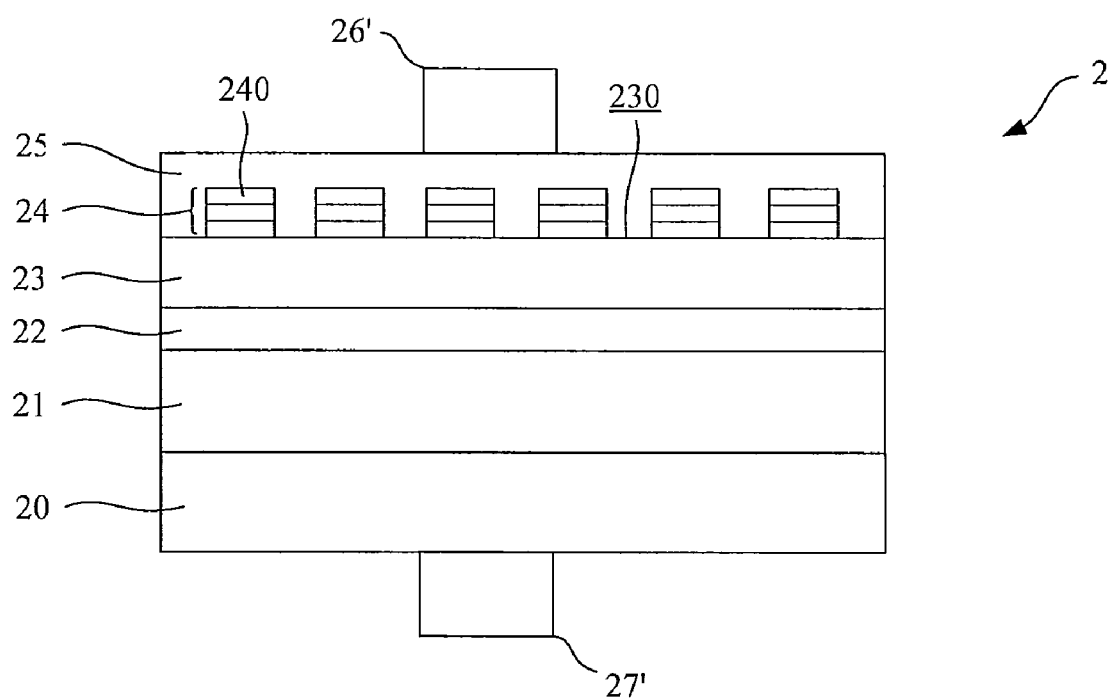

Please refer to FIG. 2F. FIG. 2F is a sectional view illustrating the light-emitting diode 2 according to another embodiment of the invention. The main difference between the light-emitting diodes in FIG. 2A and the FIG. 2F is that the electrodes (26', 27') of the light-emitting diode 2 in FIG. 2F are respectively formed on the transparent conductive layer 25 and a bottom surface of the substrate 20. To be noticed that, the substrate 20 in this embodiment is made of a conductive material. Besides, the advantage of the light-emitting diode in this embodiment is that the light-emitting layer 22 needs no etching, such that the active lighting area is enlarged. As the aforesaid description, by adjusting the thicknesses of the insulating layers properly, the laminated structures may have high optical reflection or transmittance.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A light-emitting diode with high lighting efficiency, comprising:
   a substrate;
   a first doping type semiconductor layer formed on the substrate;
   a light-emitting layer formed on the first doping type semiconductor layer;
   a second doping type semiconductor layer formed on the light-emitting layer, the second doping type semiconductor having a top surface;
   a plurality of laminated structures formed on the top surface of the second doping type semiconductor layer such that the top surface is partially exposed, wherein each laminated structure is formed in a way of alternately stacking at least one first insulated layer with a high refractive index and at least one second insulated layer with a low refractive index; and
   a conductive layer formed to cover the laminated structures and the exposed part of the top surface of the second doping type semiconductor layer.

2. The light-emitting diode of claim 1, wherein the first insulated layer is made of one material or a mixture of at least two materials selected from the group consisting of $Si_3N_4$, $TiO_2$, $Ta_2O_5$, $Nb_2O_5$, $CeO_2$ and ZnS, the second insulated layer is made of $SiO_2$ and/or $MgF_2$.

3. The light-emitting diode of claim 1, wherein the conductive layer is made of a transparent conductive material.

4. The light-emitting diode of claim 1, wherein the conductive layer is made of a metal material.

5. The light-emitting diode of claim 1, wherein the first doping type semiconductor layer is N-type, and the second doping type semiconductor layer is P-type.

6. The light-emitting diodes of claim 1, wherein the first doping type semiconductor layer and the second doping type semiconductor layer are both made of a nitride material.

7. The light-emitting diode of claim 1, further comprising a first electrode and a second electrode, the first electrode being formed on the first doping type semiconductor layer, the second electrode being formed on the conductive layer.

8. The light-emitting diode of claim 7, wherein the first electrode and the second electrode are both made of a Cr—Au alloy.

9. The light-emitting diode of claim 1, further comprising a first electrode and a second electrode, the first electrode being formed on the conductive layer, the second electrode being formed on a bottom surface of the substrate.

10. The light-emitting diode of claim 1, wherein the substrate is made of a transparent material.

11. The light-emitting diode of claim 1, wherein the light-emitting diode is reversely implemented.

* * * * *